(12) United States Patent
Minami

(10) Patent No.: US 8,505,991 B2
(45) Date of Patent: Aug. 13, 2013

(54) CONVEYING DEVICE AND VACUUM APPARATUS

(75) Inventor: Hirofumi Minami, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 123 days.

(21) Appl. No.: 13/086,673

(22) Filed: Apr. 14, 2011

(65) Prior Publication Data

US 2011/0211936 A1    Sep. 1, 2011

Related U.S. Application Data

(63) Continuation of application No. PCT/JP2009/067842, filed on Oct. 15, 2009.

(30) Foreign Application Priority Data

Oct. 17, 2008    (JP) .................................. 2008-268475

(51) Int. Cl.
   B25J 15/02    (2006.01)
   H01L 21/687   (2006.01)

(52) U.S. Cl.
   USPC .............. 294/103.1; 294/213; 414/744.5; 414/744.8; 414/941

(58) Field of Classification Search
   USPC ........ 294/213, 103.1, 119.1, 116; 414/744.5, 414/744.8, 941
   See application file for complete search history.

(56) References Cited

U.S. PATENT DOCUMENTS

| | | | | |
|---|---|---|---|---|
| 5,702,228 A | * | 12/1997 | Tamai et al. ............... | 414/744.5 |
| 6,155,773 A | * | 12/2000 | Ebbing et al. .............. | 414/744.5 |
| 6,283,701 B1 | * | 9/2001 | Sundar et al. ............... | 414/744.5 |
| 6,364,599 B1 | | 4/2002 | Suwa et al. | |
| 6,682,113 B2 | * | 1/2004 | Cox et al. ....................... | 294/104 |
| 6,817,640 B2 | * | 11/2004 | Menon et al. ............... | 294/103.1 |
| 6,913,302 B2 | * | 7/2005 | Yokota et al. ............... | 294/103.1 |
| 7,140,655 B2 | * | 11/2006 | Kesil et al. .................... | 294/104 |
| 2003/0035711 A1 | * | 2/2003 | Gilchrist .................... | 414/744.5 |

FOREIGN PATENT DOCUMENTS

| | | |
|---|---|---|
| JP | 5-100199 | 4/1993 |
| JP | 9-38875 | 2/1997 |
| JP | 10-22357 | 1/1998 |
| JP | 2000-308988 | 11/2000 |
| JP | 2002-127063 A1 | 5/2002 |
| JP | 2002-353291 A1 | 12/2002 |
| JP | 2003-258076 A1 | 9/2003 |
| JP | 2007-134526 A1 | 5/2007 |
| JP | 2008-302437 A1 | 12/2008 |
| JP | 2009-83031 A1 | 4/2009 |

* cited by examiner

OTHER PUBLICATIONS

International Search Report for International Application No. PCT/JP2009/067842 dated Dec. 17, 2009.

*Primary Examiner* — Dean Kramer
(74) *Attorney, Agent, or Firm* — Kratz, Quintos & Hanson, LLP

(57) ABSTRACT

The present invention provides a technology for holding an object to be reliably conveyed for the sake of high speed conveyance not only in a low temperature environment but also in a high temperature environment, and for reducing dust while conveying the object to be conveyed. A conveying device includes a link mechanism, which can expand and contract, has a plurality of arms to which power from a drive source is transmitted, and a mounting section which is connected to an operating tip section of the link mechanism through a drive link section and on which a substrate is mounted. The mounting section has latch sections for making contact with and latching side portions of the substrate.

8 Claims, 13 Drawing Sheets

CONVEYING DEVICE AND VACUUM APPARATUS

This application is a continuation of International Application No. PCT/JP2009/067842, filed on Oct. 15, 2009, which claims priority to Japan Patent Application No. 2008-268475, filed on Oct. 17, 2008. The contents of the prior applications are herein incorporated by reference in their entireties.

BACKGROUND

The present invention generally relates to a conveying device which conveys an object to be conveyed (such as, a substrate), and in particular to a conveying device that is suitable for a vacuum apparatus having a plurality of process chambers (such as, a semiconductor manufacturing apparatus).

In the field of semiconductor manufacturing, a substrate conveying device 101 (such as, shown in FIGS. 14 and 15 has been used heretofore).

The substrate conveying device 101 has a drive section 102, an arm section 103 which is connected to the drive section 102 including a plurality of arms, and an end effector 104 which is connected to the extremity of the arm section 103. The substrate conveying device 101 is configured to support the backside of a substrate W with the top surface of the end effector 104, and transfer the substrate W between a plurality of process chambers (not shown).

The end effector 104 is typically made of ceramics, stainless steel, or the like. If the arm 103 is operated to extend, contract, or rotate at high speed, the end effector 104 also moves at high speed so that there is a problem such that the acceleration on the substrate W makes the substrate W slide over the end effector 104 and the substrate W fails to be conveyed to a proper position.

The conventional technology also has a problem such that the surface of the substrate W can be contaminated with dust generated when the substrate W slides over the end effector 104.

As shown in FIG. 15, it has thus been proposed to provide a plurality of holding sections 105 on the top surface of the end effector 104 so as to make contact with the backside of the substrate W at predetermined points.

The holding sections 105 are typically made of an elastic resin material (such as, rubber and elastomers) and function as antislip pads for suppressing the sliding at the backside of the substrate W. The substrate W can thus be held in a stable conveyance position without sliding over the top surface of the end effector 104 (see, for example, JPA2002-353291).

The holding sections 105 made of an elastic resin material (such as, an elastomer) effectively suppress the sliding of the substrate W when the substrate W and the ambience are relatively low in temperature (for example, 200° C. or lower). If the temperature is high (for example, 300 to 500° C.), however, there is a problem such that the holding sections 105 fail to suppress the sliding of the substrate W due to thermal alteration or deformation.

Even when the temperature is relatively low (for example, 200° C. or lower), the adhesion of the holding sections 105 may sometimes make the substrate W stick to and not properly detachable from the end effector 104. For example, there are problems such that the substrate W sticking to the holding sections 105 may be broken when the substrate W is transferred to a stage in a process chamber, and such that the substrate W cannot be conveyed to a proper position.

Moreover, since the sliding of the substrate W is suppressed in principle by the frictional force between the holding sections 105 and the substrate W, the substrate W slides over the end effector 104 when the substrate W undergoes acceleration beyond the maximum static frictional force which is determined by both the materials. Consequently, there is a problem in that it is impossible to increase the operating speed of the conveying device 101 beyond the maximum static frictional force between the holding sections 105 and the substrate W.

SUMMARY OF THE INVENTION

The present invention has been achieved in order to solve the foregoing problems of the conventional technologies. It is thus an object of the present invention to hold an object to be conveyed reliably for the sake of high speed conveyance in both an environment where the temperature of the object to be conveyed and the ambience is relatively low and an environment where the temperature is high.

Another object of the present invention is to provide technology for minimizing dust when conveying an object to be conveyed.

The present invention has been achieved in order to achieve the foregoing objects, and provides a conveying device including an extensible link mechanism that has a plurality of arms to which power from a drive source is transmitted; and a mounting section that is connected to an operating tip section of the link mechanism through a drive link section and on which an object to be conveyed is mounted, the mounting section having a latch section for making contact with and latching a side portion of the object to be conveyed, the drive link section of the link mechanism being provided with a cam mechanism-based pressing means. The pressing means includes a cam drive surface that is formed on a pair of the adjacent drive link section of the link mechanism, respectively, and a pair of a follower roller in contact with and capable of following the cam drive surface, respectively, and the follower mechanism section has a pressing section to be guided and moved along a direction toward the latch section of the mounting section by movement of the pair of the follower roller.

In the present invention, the follower mechanism section of the pressing means may have a pressing force adjusting member for adjusting a pressing force on the cam drive surface.

In the present invention, the pressing section of the follower mechanism section of the pressing means may have a force reducing member for reducing the pressing force of the pressing section.

In the present invention, the latch section of the mounting section may have a gripping mechanism that presses the object to be conveyed and grips the object to be conveyed with the pressing means, the gripping mechanism being driven by a drive mechanism that moves toward the pressing means according to an operation of the drive link section of the link mechanism.

The present invention is also effective when the drive mechanism is provided with a drive section of a cam type and the gripping mechanism is provided with a gripping section of a cam type that is driven by the drive section of a cam type.

The present invention is also effective when the drive mechanism is provided with a drive section of a cam type and the gripping mechanism is provided with a gripping section of a link type that is driven by engagement with the drive section of a cam type.

In the present invention, it is also effective that: the device includes two of the gripping mechanism; and that the gripping sections of the respective gripping mechanisms are arranged to be symmetrical with respect to a straight line that extends in a direction of substrate conveyance through center axes of rotation of the first and second drive shafts.

The present invention also provides a vacuum apparatus including a vacuum chamber and any one of the foregoing conveying devices, the mounting section of the conveying device being configured to carry in and out of the vacuum chamber.

According to the present invention, the pressing means which operates by a cam mechanism is provided on the operating tip section of the link mechanism so that the object to be conveyed is mechanically gripped by the pressing section of the follower mechanism section and the latch section of the mounting section. It is therefore possible to suppress the sliding of the object to be conveyed over the top surface of the mounting section (in principle, eliminate the sliding) for high speed conveyance of the object to be conveyed.

All the members including the pressing means may be made of metal. This makes it possible to suppress the sliding of the object to be conveyed without thermal alteration or deformation not only in an environment where the object to be conveyed and the ambience are relatively low in temperature, but also with high conveyance temperatures (for example, 300 to 500° C.).

Since the pressing means is configured to transmit power with a cam and a roller, it is possible to provide a small-sized conveying device with simple configuration.

Since the parts for gripping the object to be conveyed have no sliding portion, it is possible to reduce the production of dust that may contaminate the object to be conveyed.

In the present invention, if the follower mechanism section of the pressing means has the pressing force adjusting member for adjusting the pressing force on the cam drive surface, the follower roller of the follower mechanism section can be pressed against and be in close contact with the cam drive surface with an appropriate force. It is therefore possible to move the follower mechanism section to the downstream side in the direction of substrate conveyance along a guide member with reliability and high precision.

In the present invention, if the pressing section of the follower mechanism section of the pressing means has the force reducing member for reducing the pressing force, the object to be conveyed can be reliably held with an optimum force depending on the device configuration, the size of the object to be conveyed, or the like.

If, in the present invention, the latch section of the mounting section includes the gripping mechanism that presses the object to be conveyed and grips the object to be conveyed with the pressing means, the gripping mechanism being driven by the drive mechanism that moves toward a direction of the pressing means according to the operation of the drive link section of the link mechanism, then the object to be conveyed can be reliably held (gripped) from both sides in the direction of substrate conveyance.

In the present invention, if the drive mechanism has the drive section of a cam type and the gripping mechanism has the gripping section of a cam type to be driven by the drive section of a cam type, the sliding portion of the cam mechanism can be located at a lower side of the object to be conveyed (a substrate such as a wafer), so that the surface of the object to be conveyed can be prevented from contamination generated by the sliding portion, for example.

According to the present invention, if the drive mechanism has the drive section of a cam type and the gripping mechanism has the gripping section of a link type to be driven by engagement with the drive section of a cam type, the sliding portion of the link mechanism can be located lateral to and far from the object to be conveyed (a substrate (such as, a wafer)), so that the surface of the object to be conveyed can be prevented from contamination with dust generated by the sliding portion, for example.

In the present invention, if the device includes two of the gripping mechanism and the gripping sections of the respective gripping mechanisms are arranged to be symmetrical with respect to a straight line that extends in the direction of substrate conveyance through the center axes of rotation of the first and second drive shafts, the substrate can be pressed and held (gripped) in a well-balanced manner by the two gripping mechanisms.

DETAILED DESCRIPTION OF THE INVENTION

Hereinafter, preferred embodiments of the present invention will be described in detail in reference to the drawings.

Figure 1:
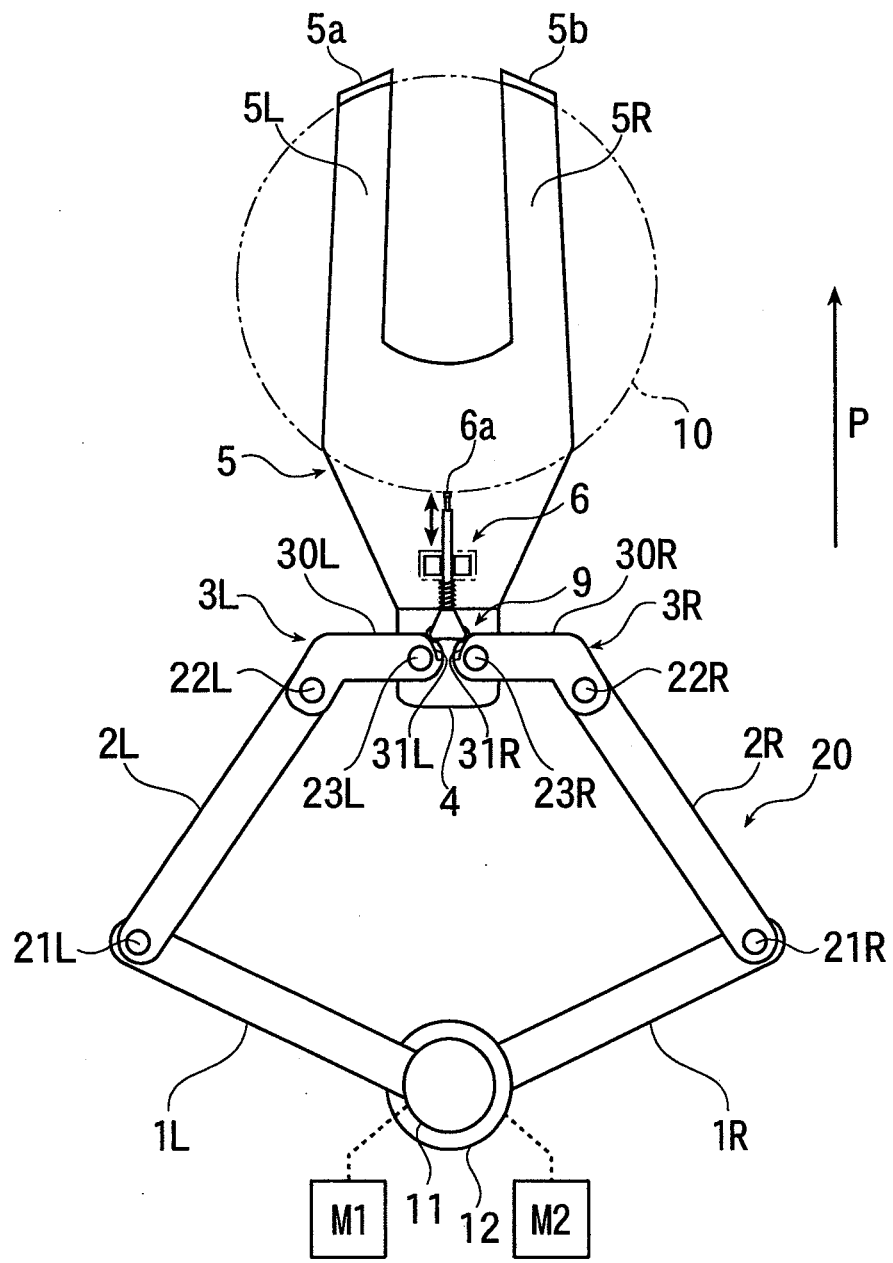
FIG. 1 is a plan view showing an embodiment of the conveying device according to the present invention.

FIG. 1 is a plan view showing an embodiment of the conveying device according to the present invention.

As shown in FIG. 1, the conveying device 50 of the present embodiment is of a so-called frog leg type, which conveys a substrate 10 or an object to be conveyed in a vacuum processing chamber, for example. The conveying device 50 has first and second drive shafts 11 and 12 for driving a link mechanism 20 to be described later and are concentrically arranged in a vertical direction.

The drive shafts 11 and 12 are configured so that clockwise and counterclockwise rotational power is transmitted thereto from independent first and second drive sources M1 and M2, respectively.

An end (base end) of a first left arm 1L is fixed to the first drive shaft 11 and a first right arm 1R is fixed to an end (base end) of the second drive shaft 12.

An end (base end) of a second left arm 2L is attached to the other end (top end) of the first left arm 1L so as to be horizontally rotatable about a spindle 21L.

An end (base end) of a second right arm 2R is attached to the other end (top end) of the first right arm 1R so as to be horizontally rotatable about a spindle 21R.

In the present embodiment, the first left arm 1L and the first right arm 1R are formed in a straight shape and configured to have the same span between fulcrum points.

The second left arm 2L is formed in a straight shape, an end (bottom end) of a third left arm 3L is fixed to the other end (top end) of the second arm 21 with a fixation screw 22L.

The second right arm 2R is formed in a straight shape, an end (bottom end) of a third right arm 3R is fixed to the other end (top end) of the second right arm 2R with a fixation screw 22R.

Here, the third left arm 3L and the third right arm 3R constitute a drive link section are formed in a generally "L" shape, and are arranged with the protruded portions of their respective bends toward the outside of the link.

The other end (top end) of the third left arm 3L is horizontally rotatably attached about a spindle 23L which is arranged on the surface of a power transmission mechanism 4 to be described later.

The other end (top end) of the third right arm 3R is horizontally rotatably attached about a spindle 23R which is arranged, for example, on the surface side of the power transmission mechanism 4 to be described later.

The present embodiment is configured such that the span between the spindle 21L of the second left arm 2L and the spindle 23L of the third left arm 3L, and the span between the spindle 21R of the second right arm 2R and the spindle 23R of the third right arm 3R have the same distance.

The power transmission mechanism 4 also has a pair of gears (not shown) that are engaged with each other in a housing of rectangular slim box shape, for example.

The gears have the same numbers of teeth, and their rotation shafts are fixed to the above-discussed spindles 23L and 23R, respectively, whereby the gears are rotated in opposite directions at the same speed so as to function as an orientation control mechanism.

Such spindles 23L and 23R are arranged close to each other in a direction orthogonal to the direction of substrate conveyance.

In the present invention, the arrangement of the spindles 23L and 23R is not particularly limited. In terms of holding the objected to be conveyed in a well-balanced manner, however, it is preferred that the spindles 23L and 23R are arranged in positions that are orthogonal to the direction of substrate conveyance that pass the center axis of rotation of the first and second drive shafts 11 and 12 (the direction of the arrow P).

Amounting section 5, called an end effector, is provided on the downstream side of the power transmission mechanism 4 in the direction of substrate conveyance.

The mounting section 5 has support members 5L and 5R which are arranged at a predetermined distance from each other.

Latch sections 5a and 5b each having a protruding shape, capable of making contact with side portions of the substrate 10, are formed at the ends of the respective support members 5L and 5R on the downstream side in the direction of substrate conveyance.

The latch sections 5a and 5b are formed to be symmetrical with respect to a straight line that extends in the direction of substrate conveyance through the center axis of rotation of the first and second drive shafts 11 and 12.

In the present embodiment, there are provided cam mechanism-based pressing means 9 to be described below.

Figure 2A:
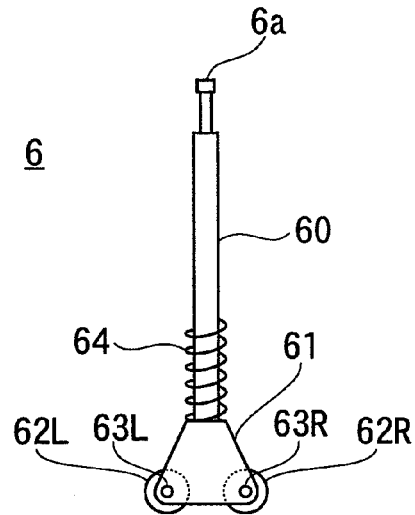
FIG. 2(a) is a configuration diagram showing a follower mechanism section of pressing means in an embodiment.
Figure 2B:
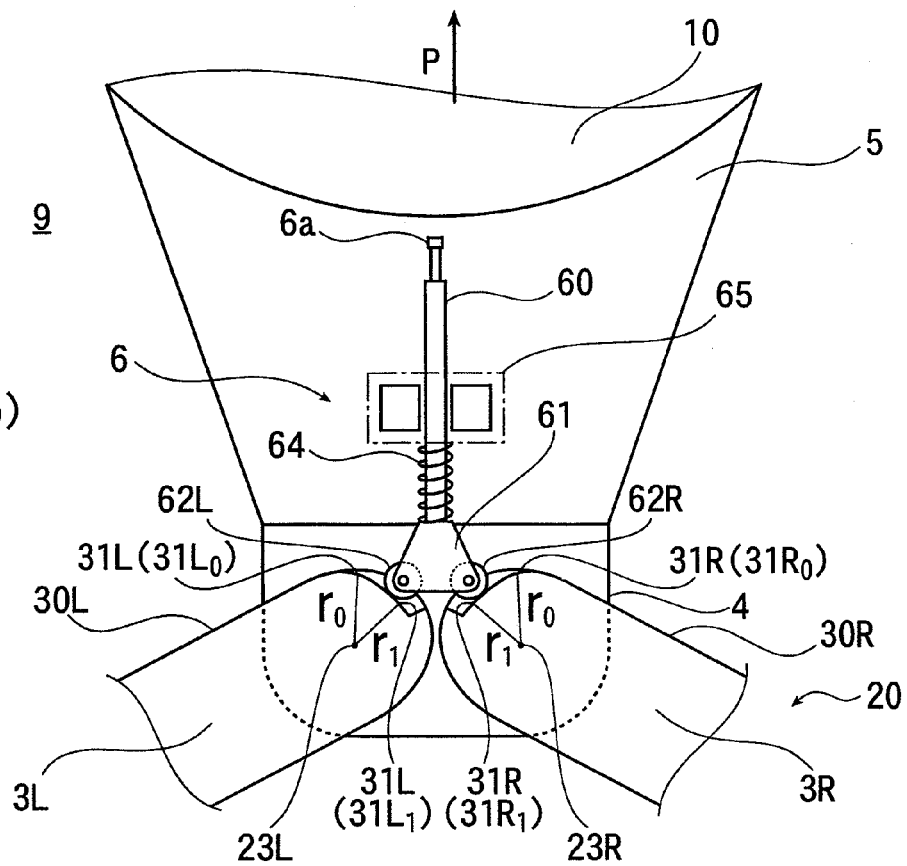
FIG. 2(b) is a configuration diagram showing the entire pressing means in the present embodiment.

FIG. 2(*a*) is a diagram showing a follower mechanism section of the pressing means in the present embodiment. FIG. 2(*b*) is a diagram showing the entire pressing means in the present embodiment.

As shown in FIG. 2(*b*), in the present embodiment, the third left arm 3L and the third right arm 3R are formed to have a top end of semicircular shape, respectively. Circular cam drive surfaces 31L and 31R are formed on the downstream sides of the respective top ends in the direction of substrate conveyance. The pressing means 9 are composed of the cam drive surfaces 31L and 31R of the third left arm 3L and the third right arm 3R and the follower mechanism section 6 shown in FIG. 2(*a*).

Here, the cam drive surfaces 31L and 31R of the third left arm 3L and the third right arm 3R are formed to have a circular shape convex to the downstream side in the direction of substrate conveyance, for example, by forming a step-like notch in the upper surfaces of the third left arm 3L and the third right arm 3R, respectively.

In the present embodiment, the cam drive surfaces 31L and 31R of the third left arm 3L and the third right arm 3R are each configured such that the amount of displacement $r_1$ on the top end side (the distance between the spindle 23L and an inner contact surface $31L_1$, the distance between the spindle 23R and an inner contact surface $31R_1$) is smaller than the amount of displacement $r_0$ on the base end side (the distance between the spindle 23L and an outer contact surface $31L_0$, the distance between the spindle 23R and an outer contact surface $31R_0$) ($r_1 < r_0$).

In this example, the cam drive surfaces 31L and 31R of the third left arm 3L and the third right arm 3R are formed to be symmetrical with respect to a straight line that extends in the direction of substrate conveyance through the center axis of rotation of the first and second drive shafts 11 and 12.

The follower mechanism section 6 of the present embodiment has a body section 60 having a straight bar shape which is made of a metal member, preferably stainless steel or the like.

A support member 61 having, for example, trapezoidal shape is attached to one end of the body section 60 of the follower mechanism section 6. Follower rollers 62L and 62R of a perfect circular shape having the same diameter, for example, are arranged on respective ends of the bottom of the trapezoidal support member 61.

The follower roller 62L and 62R are arranged, for example, so as to be symmetrical with respect to a straight line in the direction of extension of the body section 60, and are configured to rotate about spindles 63L and 63R which are in a direction orthogonal to a plan that includes the body section 60.

A pressing section 6a of, for example, a protruding shape (here, pin shape) is attached to the other end of the body section 60 of the follower mechanism section 6. To avoid dust production, the top end of the pressing section 6a can be coated with a heat resistant resin material (such as, PTFE (polytetrafluoroethylene resin)).

A compression coil spring 64 is attached around the body section 60, between the midsection of the body section 60 of the follower mechanism section 6 and the support member 61 discussed above. The top portion of the compression coil spring 64 is fixed to the support member 61.

In the present embodiment, as shown in FIG. 2(*b*), the follower rollers 62L and 62R of the follower mechanism section 5 are put into contact with the cam drive surfaces 31L and 31R of the third left arm 3L and the third right arm 3R, respectively. In that state, the body section 60 of the follower mechanism section 6 is guided by a guide member 65 which is arranged on the surface of the mounting section 5, for example, whereby the body section 60 is moved straight in the direction of substrate conveyance through the center axis of rotation of the first and second drive shafts 11 and 12.

In such a case, the compression coil spring 64 attached to the body section 60 of the follower mechanism section 6 makes contact with and is stopped by the guide member 65 at the end portion of the compression coil spring 64 on the side of the pressing section 6a. By the elastic force, the follower rollers 62L and 62R of the follower mechanism section 6 are pressed against the cam drive surfaces 31L and 31R of the third left arm 3L and the third right arm 3R.

Next, the principle of operation and configuration of the present invention will be described in detail in reference to FIGS. 3(*a*) and 3(*b*).

In the embodiment of the present invention, as shown in FIG. 3(*a*), the angle formed between an attachment surface 30L of the third left arm 3L and an attachment surface 30R of the third right arm 3R is set to be greater than, for example, 180 degrees when the link mechanism 20 is expanded.

As shown in FIG. 3(*b*), when the link mechanism 20 is contracted, the angle formed between the attachment surface 30L of the third left arm 3L and the attachment surface 30R of the third right arm 3R is set to be smaller than, for example, 180 degrees.

In such a configuration, as shown in FIG. 3(*a*), the length of the follower mechanism section 6 (here, the distance from the top end of the pressing section 6a to the inner contact surfaces $31L_1$ and $31R_1$ of the cam drive surfaces 31L and 31R with the follower rollers 62L and 62R) is set such that when the link mechanism 20 is expanded, the pressing section 6a on the downstream side of the follower mechanism section 6 in the direction of substrate conveyance makes no contact with a side portion of the substrate 10 to be conveyed; and also, the angles of the attachment surfaces 30L and 30R of the third left arm 3L and the third right arm 3R, and the amount of displacement $r_1$ of the cam drive surfaces 31L and 31R are set to determine the distance from the inner contact surfaces $31L_1$ and $31R_1$ of the follower rollers 62L and 62R to the side portion of the substrate 10 as a distance D.

On the other hand, when the link mechanism 20 is contracted, as shown in FIG. 3(*b*), the angle formed between the attachment surface 30L of the third left arm 3L and the attachment surface 30R of the third right arm 3R is smaller than 180 degrees. The follower rollers 62L and 62R of the follower mechanism section 6 move along the cam drive surfaces 31L and 31R of the third left arm 3L and the third right arm 3R toward the outer contact surfaces $31L_0$ and $31R_0$, respectively. As a result, the distance from the spindle 23L and 23R of the third left arm 3L and the third right arm 3R to the respective cam drive surfaces 31L and 31R increases ($r_0 > r_1$).

In such a case, according to the present embodiment, an angle of the contact area of respective cam drive surfaces 31L and 31R, with the follower rollers 62L and 62R of the follower mechanism section 6 to the straight lines that extends to the substrate conveyance direction from the respective spindles 23L, 23R when the link mechanism 20 is contracted, is smaller than the angle when the link mechanism 20 is expanded ($\theta_0 < \theta_1$). When the third left arm 3L and the third right arm 3R are rotated to the contracting directions, the follower mechanism section 6 moves to the downstream side in the direction of substrate conveyance, thereby decreasing the distance from the contact ends of the follower rollers 62L and 62R to the side portion of the substrate 10 to be conveyed ($r_0 \cdot \cos\theta_0 > r_1 \cdot \cos\theta_1$; i.e., d<D).

As a result, the part of the follower mechanism section 6 on the downstream side in the direction of substrate conveyance (pressing section 6a) comes into contact with the side portion of the substrate 10 to be conveyed, and force F toward the latch sections 5a and 5b of the mounting section 5 acts on the side portion of the substrate 10. Consequently, the substrate 10 undergoes pressing force both from the upstream side and downstream side in the direction of substrate conveyance, whereby the substrate 10 is held (gripped) on the mounting section 5.

In the present embodiment, the foregoing operation brings the downstream side of the compression coil spring 64 in the direction of conveyance into contact with the guide member 65 for compression. By the elastic force of the compression coil spring 64, the follower rollers 62L and 62R of the follower mechanism section 6 are pressed against and put into close contact with the cam drive surfaces 31L and 31R of the third left arm 3L and the third right arm 3R, whereby the follower mechanism section 6 is moved to the downstream side in the direction of the substrate conveyance along the guide member 65 with reliability and high precision.

With the link mechanism 20 in such a contracted state, the first left arm 1L and the first right arm 1R can be rotated in the same direction to make a turn while holding the substrate 10.

FIGS. 4(*a*) to 4(*c*) are explanatory diagrams showing the operation of the conveying device in the present embodiment.

Here, a description will be given of an example where the substrate 10 is carried into a process chamber 8 from a conveyance chamber 7. It should be appreciated that the conveyance chamber 7 and the process chamber 8 are connected to a vacuum evacuation system (not shown). Agate valve (not shown) is interposed between the conveyance chamber 7 and the process chamber 8. The gate valve is opened before carry-in and carry-out operations.

Initially, as shown in FIG. 4(*a*), the link mechanism 20 is contracted to hold the substrate 10 as discussed above, and the latch sections 5a and 5b of the mounting section 5 are directed toward the process chamber 8.

In that state, the expanding operation of the link mechanism 20 is started by rotating the first left arm 1L clockwise and rotating the first right arm 1R counterclockwise. As shown in FIG. 4(*b*), the substrate 10 moves straight toward the process chamber 8.

The expanding operation of the link mechanism 20 is continued to carry the substrate 10 into the process chamber 8 as shown in FIG. 4(*c*).

In such a case, as described in reference to FIG. 3(*a*), the pressing section 6a of the follower mechanism section 6 and the side portion of the substrate 10 are not in contact with each other. The substrate 10 can thus be supported and lifted by a lifting mechanism (not shown) which is installed in the process chamber 8, whereby the substrate 10 is detached from the mounting section 5 of the conveying device 50.

The timing when the contact between the pressing section 6a of the follower mechanism section 6 and the side portion of the substrate 10 is released may be simultaneous with when the link mechanism 20 is fully expanded, or may be before (immediately before) the link mechanism 20 is fully expanded. The timing may be appropriately changed depending on the size, arrangement, and configuration of the conveying device and a vacuum apparatus to which the present invention is applied.

Subsequently, the first left arm 1L is rotated counterclockwise and the first right arm 1R is rotated clockwise to make a contracting operation of the link mechanism 20, whereby the mounting section 5 can be moved back into the conveyance chamber 7.

As discussed above, according to the present embodiment, the pressing means 6 which operates by a cam mechanism is arranged on the operating tip section of the link mechanism 20 so that the substrate 10 is mechanically gripped and held by the latch sections 5a and 5b and the pressing section 6a of the follower mechanism section 6 which moves to the downstream side in the direction of substrate conveyance. This makes it possible to suppress the sliding of the substrate 10 over the top surface of the mounting section 5 (in principle, eliminate the sliding) and high speed conveyance of the substrate 10 can be carried out.

Since all the members, including the follower mechanism section 6, are made of metal, it is possible to suppress the sliding of the substrate 10 without thermal alteration or deformation not only in an environment where the object to be conveyed and the ambience are relatively low temperature, but also with high conveyance temperatures (for example, 300 to 500° C.).

The pressing section 6a of the follower mechanism 6 is a member of protruding shape, and has no sliding portion where the substrate 10 is gripped so that the outbreak of dust, which contaminate the substrate 10, can be reduced.

Figure 5:
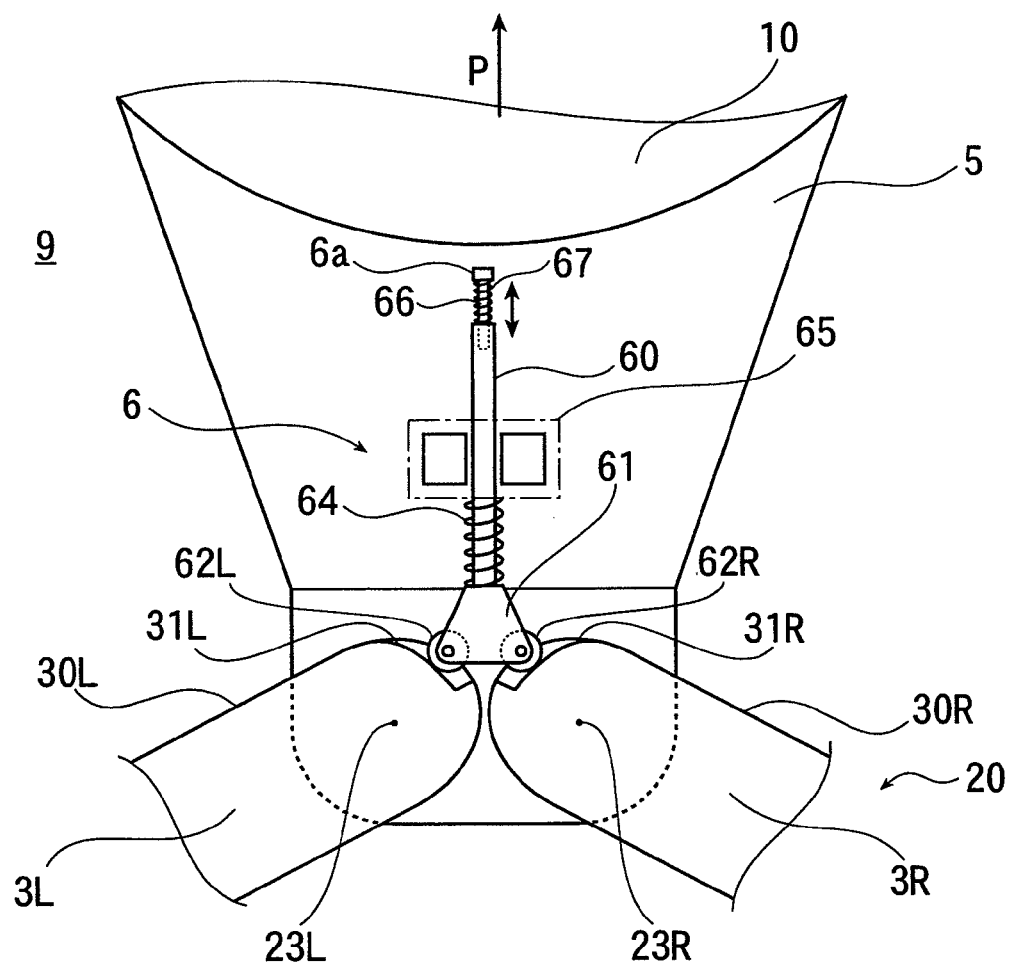
FIG. 5 is a configuration diagram showing essential parts of another embodiment of the present invention.
Figure 6:
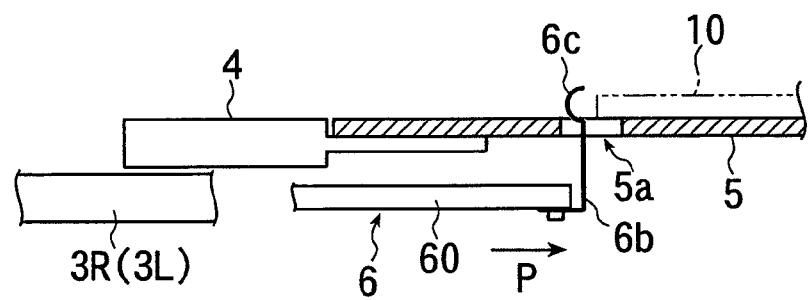
FIG. 6 is a partial sectional side view showing essential parts of yet another embodiment of the present invention.
Figure 7:
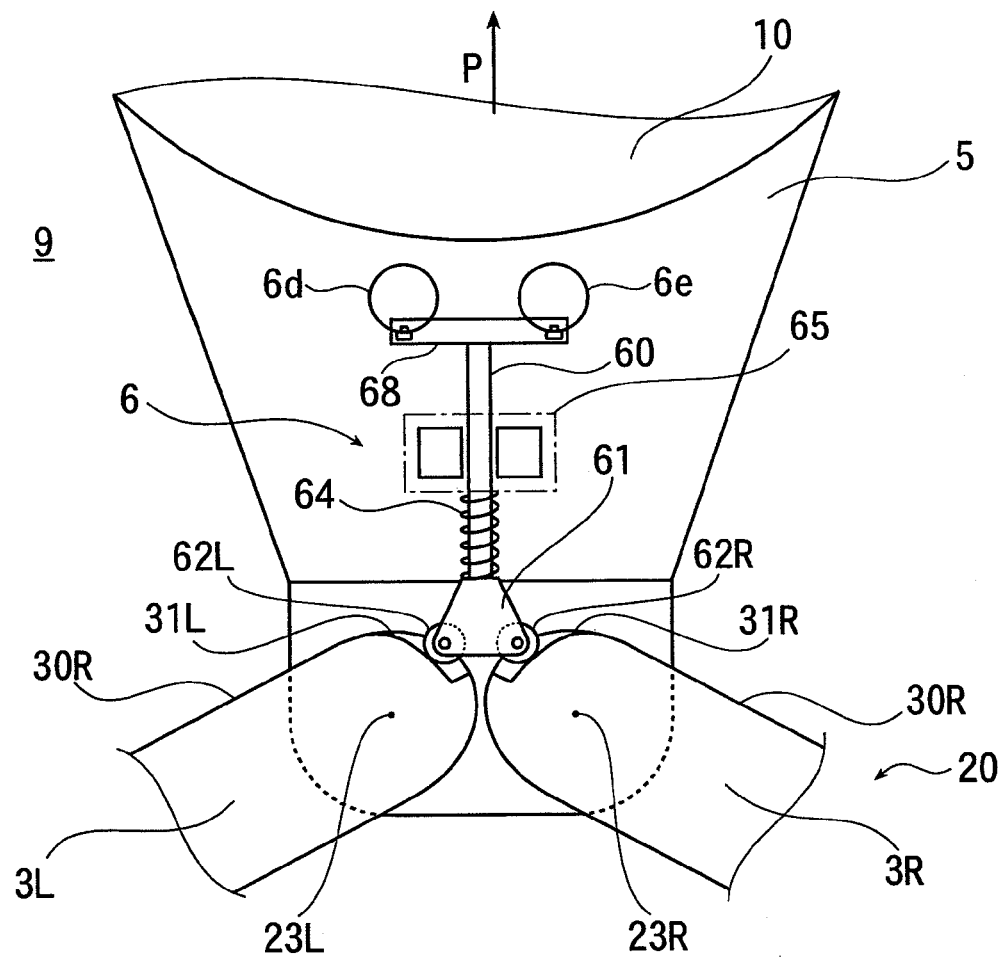
FIG. 7 is a configuration diagram showing essential parts of yet another embodiment of the present invention.

FIGS. 5 to 7 show other embodiments of the present invention. Parts corresponding to those of the foregoing embodiment will hereinafter be designated by identical reference numerals, and a detailed description thereof will be omitted.

FIG. 5 shows an example where the follower mechanism section of the pressing means has a force reducing member for reducing the pressing force of the pressing section.

As shown in FIG. 5, in the present embodiment, a support section 66 of the pressing section 6a is configured to move in the extending direction of the body section 60. A compression coil spring (force reducing member) 67 is attached around the support section 66, between the top end of the body section 60 and the pressing section 6a. The pressing section 6a is configured to move toward the body section 60 against the elastic force from the compression coil spring 67 when the top end of the pressing section 6a undergoes force toward the body section 60.

According to the present embodiment having such a configuration, it is possible to adjust the pressing force on the substrate 10 when holding (gripping) the substrate 10, so that it provides the advantages of higher design freedom and higher versatility depending on various types of object to be conveyed and the device configuration.

FIG. 6 is a partial sectional side view showing essential parts of yet another embodiment of the present invention. The third left arm 3L and the third right arm 3R are located under the power transmission mechanism 4.

As shown in FIG. 6, in the present embodiment, the follower mechanism section 6 of the foregoing configuration is arranged on the top ends of the third left arm 3L and the third right arm 3R. The body section 60 is configured to move straight along the direction of substrate conveyance.

A force reducing member 6b is attached to the extremity of the body section 60 of the follower mechanism section 6. The force reducing member 6b is made of a plate-shaped elastic material of metal (such as, stainless steel), and is arranged upward from the extremity of the body section 60.

A pressing section 6c having, for example, a recessed shape is provided on the extremity of the force reducing member 6b. The pressing section 6c protrudes upward from the mounting section 5 through a hole 5a formed in the mounting section 5, and is configured so that the recessed surface of the pressing section 6c comes into contact with or away from the side portion of the substrate 10 depending on the movement of the follower mechanism section 6.

According to the present embodiment having such a configuration, it is possible to adjust the pressing force on the substrate 10 when holding (gripping) the substrate 10 as in the foregoing embodiments.

Furthermore, the present embodiment can be used, for example, as a wafer gripping mechanism on the lower arm of an arm mechanism that has an upper end effector and a lower end effector at a reduced vertical interval, as shown in FIGS. 22 and 23 of U.S. Pat. No. 6,364,599 B1. Incidentally, the foregoing configuration of FIGS. 2(a) and 2(b) and FIGS. 3(a) and 3(b) can be used as a wafer gripping mechanism on the upper arm of such an arm mechanism.

FIG. 7 is a configuration diagram showing essential parts of yet another embodiment of the present invention, showing an example having a force reducing member for reducing the pressing force of the pressing section.

As shown in FIG. 7, the present embodiment is a modification of the embodiment shown in FIG. 5. For example, an attachment member 68 having a straight bar shape extending in a direction orthogonal to the extending direction of the body section 60 is fixed to the top end of the body section 60 of the follower mechanism section 6. Two force reducing and pressing sections 6d and 6e having ring and belt shape, made of metal (such as, stainless steel), are attached to both ends of the attachment member 68 so as to protrude from the attachment member 68 to the downstream side in the direction of substrate conveyance.

The two force reducing and pressing sections 6d and 6e are formed in the same size and shape, and are arranged to be symmetrical with respect to a straight line that extends in the direction of substrate conveyance through the center axis of rotation of the first and second drive shafts 11 and 12.

According to the present embodiment having such a configuration, similar to the embodiments shown in FIG. 5, it is possible to adjust the pressing force on the substrate 10 when holding (gripping) the substrate 10. Furthermore, since the substrate 10 is pressed by the two force reducing and pressing sections 6d and 6e, which are arranged symmetrically with respect to the direction of substrate conveyance, there is the advantage that the substrate 10 can be held (gripped) in a well-balanced manner.

Like the embodiment shown in FIG. 6, the present embodiment may be configured such that the third left arm 3L, the third right arm 3R, and the follower mechanism section 6 are located under the power transmission mechanism 4.

In such a case, similar to the embodiment shown in FIG. 6, a hole (not shown) is formed in the mounting section 5, and the attachment member 68 and the force reducing and pressing sections 6d and 6e are located above the mounting section 5 through the hole so that the force reducing and pressing sections 6d and 6e come into contact with or move away from the side portions of the substrate 10.

According to such an embodiment, there is an advantage in that the present embodiment can be used as the wafer gripping mechanism on the lower arm of the arm mechanism that has an upper end effector and a lower end effector at a reduced vertical interval, as shown in, for example, FIGS. 22 and 23 of U.S. Pat. No. 6,364,599 B1. It should be noted that the foregoing configuration of FIG. 7 can be used as the wafer gripping mechanism on the upper arm of such an arm mechanism.

Figure 8:
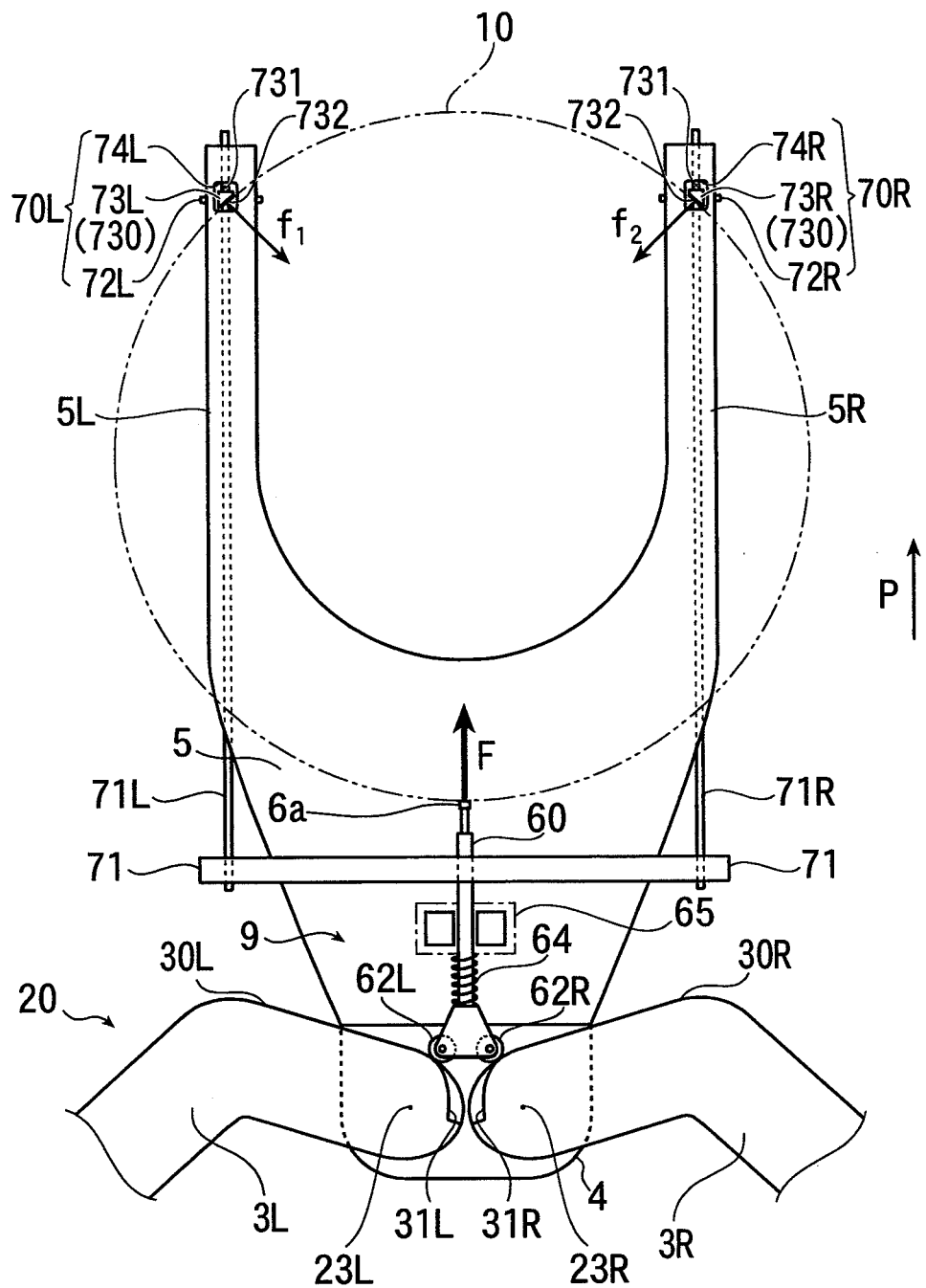
FIG. 8 is a plan view showing a pressing section and clamp latch mechanisms of yet another embodiment of the present invention.

FIGS. 8, 9(*a*), and 9(*b*) show yet another embodiment of the present invention. FIG. 8 is a plan view showing the pressing section and clamp latch mechanisms. FIG. 9(*a*) is a plan view showing essential parts of a clamp latch mechanism. FIG. 9(*b*) is a partial sectional view showing essential parts of the clamp latch mechanism. Parts corresponding to those of the foregoing embodiments will hereinafter be designated by identical reference numerals, and a detailed description thereof will be omitted.

As shown in FIG. 8, the present embodiment includes, as will be described later, a left clamp latch mechanism (gripping mechanism) 70L and a right clamp latch mechanism (gripping mechanism) 70R, which are arranged on the top ends of the left and right support members 5L and 5R of the mounting section 5.

Here, a base section 71 of straight bar shape extending in a direction orthogonal to the direction of substrate conveyance (the direction of the arrow P) is attached and fixed to the body section 60 of the follower mechanism section 6.

The base section 71 has almost the same length as the distance between the support members 5L and 5R of the mounting section 5. A left drive member 71L having a straight bar shape extending in the direction of substrate conveyance is attached and fixed to the left support member 5L; and a left drive member 71R having a straight bar shape extending in the direction of substrate conveyance is attached and fixed to the right support member 5R.

In the present embodiment, the left drive member 71L and the right drive member 71R are located along and under the support members 5L and 5R, respectively.

The left drive member 71L and the right drive member 71R are arranged to be symmetrical with respect to a straight line that extends in the direction of substrate conveyance through the center axis of rotation of the foregoing first and second drive shafts 11 and 12.

The left clamp latch mechanism 70L is arranged on the top end of the support member 5L; and the right clamp latch mechanism 70R is arranged on the top end of the support member 5R.

The left clamp latch mechanism 70L and the right clamp latch mechanism 70R are configured to operate by the same mechanism, and are arranged to be symmetrical with respect to a straight line that extends in the direction of substrate conveyance through the center axis of rotation of the first and second drive shafts 11 and 12.

In the present embodiment, the base section 71, the left drive member 71L, and the right drive member 71R described above constitute the drive mechanism.

In reference to FIGS. 8, 9(*a*), 9(*b*), 10(*a*), and 10(*b*), the configuration and operation of the gripping mechanism of a cam type according to the present invention will be described by making reference to the right clamp latch mechanism 70R.

As shown in FIGS. 9(*a*) and 9(*b*), the right clamp latch mechanism 70R of the present embodiment has a holding section 50 having, for example, box shape which is attached to under the support member 5R.

The right drive member 71R described above is horizontally supported on a bottom portion 50*a* of the holding section 50.

A spindle 72R which extends in the right angle direction for the direction of substrate conveyance and is horizontally situated is rotatably supported by side wall portions 50*b*, which are arranged on both sides of the holding section 50.

A right clamp latch member 73R which constitutes the right clamp latch mechanism 70L is attached and fixed to the spindle 72R.

The right clamp latch member 73R is formed in a generally "L" shape. The right clamp latch member 73R is composed of a gripping section 730 which extends vertically upward and a cam follower section 731 which extends to the downstream side of the spindle 72R in the direction of substrate conveyance.

The gripping section 730 of the right clamp latch member 73R is configured such that its extremity protrudes from an opening 74R which is formed in the support member 5R.

The gripping section 730 is formed to have a length; i.e., a span greater than the length of the cam follower section 731, and is configured such that its extremity protrudes from the opening 74R formed in the support member 5R.

In the present embodiment, as shown in FIG. 9(*b*), an end of an elastic member (such as, a tension coil spring 75) is attached to the downstream side of the gripping section 730 of the right clamp latch member 73R in the direction of substrate conveyance. The other end of the tension coil spring 75 is attached to an attachment member 76, which is arranged in a position on the downstream side of the support member 5R in the direction of substrate conveyance.

As shown in FIG. 9(*b*), the tension coil spring 75 is configured to pull the gripping section 730 of the right clamp member 73R to the downstream side in the direction of substrate conveyance.

The gripping section 730 of the right clamp latch member 73R has a gripping surface 732 having, for example, a flat shape which is tilted by a predetermined angle (for example, 45 degrees or so inward of the substrate 10 to be conveyed) with respect to the direction of substrate conveyance.

To avoid dust production, the gripping surface 732 of the right clamp latch member 73R may be coated with a heat resistant resin material (such as, PTFE (polytetrafluoroethylene resin)).

Meanwhile, the cam follower section 731 of the right clamp latch member 73R is formed slightly downward with respect to the spindle 72R. The cam follower section 731 is configured so that the portion immediately below the spindle 72R and the bottom surface 734 of the cam follower section 731 are in contact with the top surface 710 (and a cam drive surface 711 to be described below) of the drive member 71R.

The extremity of the cam follower section 731 is formed in a round shape.

In the present embodiment, the cam drive surface 711 is formed in a recessed shape, which is substantially the shape of a concave surface that fits to the bottom surface 734 of the cam follower section 731 of the right clamp latch member 73R.

To avoid dust outbreak, the contact area between the cam follower section 731 of the right clamp latch member 73R and the top surface 710 of the drive member 71R may be coated with a heat resistant resin material (such as, PTFE (polytetrafluoroethylene resin)).

The left clamp latch mechanism 70L has the same configuration as that of the foregoing right clamp latch mechanism 70R, including a spindle 72L, a left clamp latch member 73, and an opening 74L which are arranged to be symmetrical with respect to a straight line extending in the direction of substrate conveyance. The left clamp latch member 73 has a gripping section 730, a cam follower section 731, and a gripping surface 732.

The drive member 71L has the same configuration as that of the foregoing drive member 71R. The top surface of the drive member 71L is provided with a cam drive surface 711 (not shown) of a curved concave surface shape that fits to the bottom surface of the cam follower section 731 of the left clamp latch member 73L.

Next, the principle of operation and configuration of the present embodiment will be described in detail in reference to FIGS. 8, 9(a), 9(b), 10(a), and 10(b).

In the present embodiment, the length of the follower mechanism section 6 is set such that the pressing section 6a on the downstream side of the follower mechanism section 6 in the direction of substrate conveyance is not in contact with a side portion of the substrate 10 to be conveyed when the link mechanism 20 is expanded.

In such a state, the base section 71 fixed to the body section 60 of the follower mechanism section 6 lies in a predetermined position on the upstream side in the direction of substrate conveyance, whereby the left drive member 71L and the right drive member 71R are also located in predetermined positions on the upstream side in the direction of substrate conveyance.

Figure 9A:
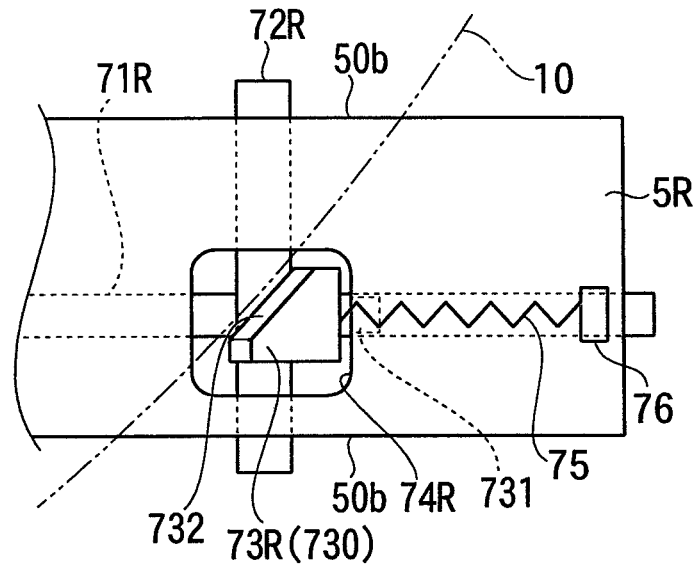
FIG. 9(a) is a plan view showing essential parts of the pressing section and a clamp latch mechanism.
Figure 9B:
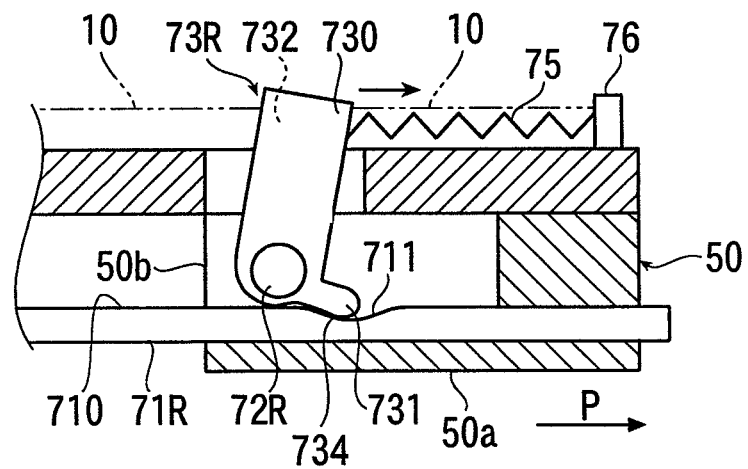
FIG. 9(b) is a partial sectional view showing essential parts of the clamp latch mechanism.

With such a positional relationship, for example, as shown in FIGS. 9(a) and 9(b), the length of the right drive member 71R, the length of the cam follower section 731 of the right clamp latch member 73R, and the length, position, and shape of the cam drive surface 711 of the right drive member 71R are set such that the bottom of the cam drive surface 711 formed in the right drive member 71R and the cam follower section 731 of the right clamp latch member 73R are located to overlap relating to the direction of substrate conveyance.

In such a state, the gripping section 730 of the right clamp latch member 73R is pulled in the direction of substrate conveyance by the tension coil spring, so that the gripping section 730 of the right clamp latch member 73R is thus rotated about the spindle 72R so as to tilt in the direction of substrate conveyance. Consequently, the cam follower section 731 of the right clamp latch member 73R is pressed against the bottom of the cam drive surface 711 of the right drive member 71R, so that the cam follower section 731 of the right clamp latch member 73R is in a resting state in contact with the bottom area of the cam drive surface 711 of the right drive member 71R.

As shown in FIG. 9(a), the position of the spindle 72R, the length and shape of the gripping section 730 of the right clamp latch member 73R, and the position and shape of the gripping surface 732 are set such that the gripping surface 732 of the right clamp latch member 73R, in such a state, is not in contact with the rim of the substrate 10.

When the third left arm 3L and the third right arm 3R, in such a state, are rotated in the directions of contracting the link mechanism 20, the base section 71, the left drive member 71L, and the right drive member 71R move in the direction of substrate conveyance along with the body section 60 of the follower mechanism section 6.

Figure 10A:
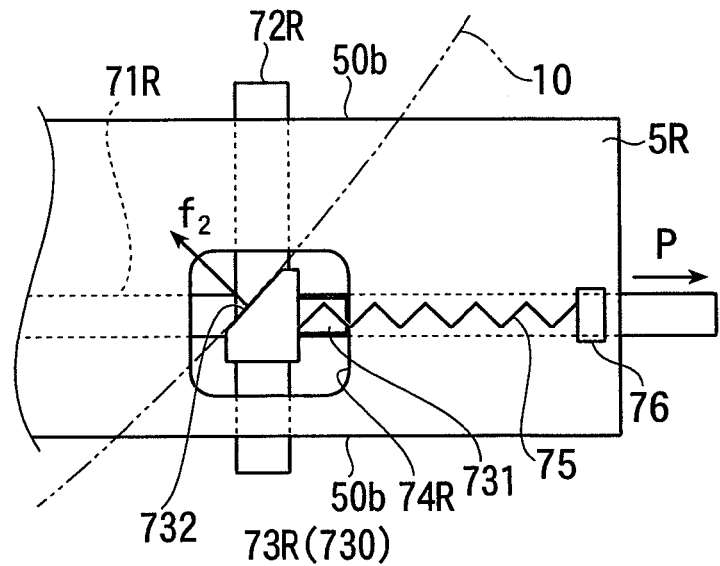
FIG. 10(a) is a plan view showing essential parts of the pressing section and the clamp latch mechanism.
Figure 10B:
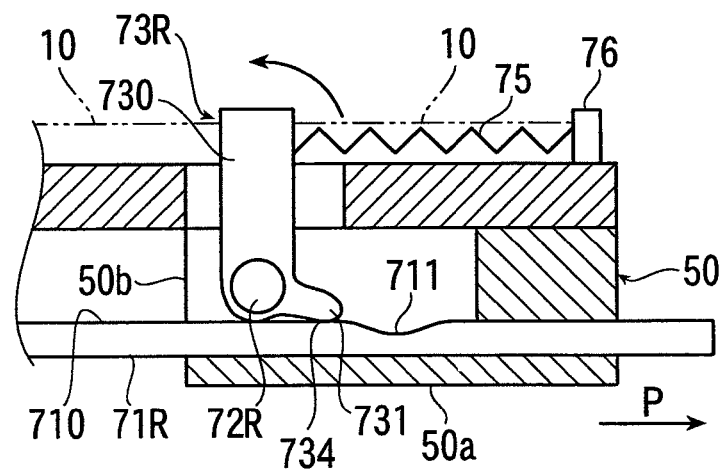
FIG. 10(b) is a partial sectional view showing essential parts of the clamp latch mechanism.

Consequently, as shown in FIGS. 10(a) and 10(b), the cam follower section 731 of the right clamp latch member 73R comes out of the cam drive surface 711 of the right drive member 71R. The bottom surface 734 of the cam follower section 731 is in contact with the top surface 710 of the drive member 71R, whereby the gripping section 730 of the right clamp latch section 73R is rotated about the spindle 72R in the direction opposite from the direction of substrate conveyance (i.e., in the erecting direction).

In the present embodiment, the position of the spindle 72R, the length and shape of the gripping section 730 of the right clamp latch member 73R, and the position and shape of the gripping surface 732, as discussed, above are set such that the gripping surface 732 of the right clamp latch member 73R makes contact with the rim of the substrate 10 that is pressed and moved by the pressing section 6a of the follower mechanism section 6 in the direction of substrate conveyance, as shown in FIG. 10(a), when the link mechanism 20 is contracted, as shown in FIG. 8.

For the left clamp latch mechanism 70L, similar to the right clamp latch mechanism 70R, the position of the spindle 72L, the length and shape of the gripping section 730 of the left clamp latch member 73L, and the position and shape of the gripping surface 732 are also set with respect to the cam drive surface 711 of the drive member 71 so that the gripping surface 732 of the left clamp latch member 73L makes contact with the rim of the substrate 10.

In the present embodiment, it is preferred, but not particularly limited thereto, that the moving distances (strokes) of the gripping section 730 of the left clamp latch member 73L and the gripping section of 730 of the right clamp latch member 73R are set to be smaller than the moving distances of the left drive member 71L and the right drive member 71R (i.e., the moving distance of the follower mechanism section 6).

According to the present embodiment having such a configuration, when the link mechanism 20 is contracted, the substrate 10 undergoes a force F in the direction of substrate conveyance from the pressing section 6a of the follower mechanism section 6, and the inward forces f1 and f2 from the left clamp latch member 73 of the left clamp latch mechanism 70L and the right clamp latch member 73R of the right clamp latch mechanism 70R, as shown in FIG. 8. As a result, the substrate 10 undergoes the pressing forces from the upstream side and downstream side in the direction of substrate conveyance, whereby the substrate 10 is reliably held (gripped) on the mounting section 5.

When the link mechanism 20 is in such a contracted state, by the rotation of the first left arm 1L and the first right arm 1R in the same direction, the link mechanism 20 can perform while circling gripping the substrate 10.

The timing when the pressing section 6a of the follower mechanism section 6, the gripping surface 732 of the left clamp latch member 73L, and the gripping surface 732 of the right clamp latch member 73R come into contact with the rim of the substrate 10 may be simultaneous with when the link mechanism 20 is fully contracted, or may be before (immediately before) the link mechanism 20 is fully contracted. The timing can be appropriately changed depending on the size, arrangement, and configuration of the conveying device and the vacuum device to which the present invention is applied.

Keeping in mind gripping the substrate 10 with high precision, the preferred configuration is such that the gripping surface 732 of the left clamp latch member 73L and the gripping surface 732 of the right clamp latch member 73R make contact with the rim of the substrate 10 after the pressing section 6a of the follower mechanism section 6 has made contact with the rim of the substrate 10.

In particular, in the present embodiment, the left clamp latch mechanism 70L (the gripping surface 732 of the left clamp latch member 73L) and the right clamp latch mechanism 70R (the gripping surface 732 of the right clamp latch member 73R) are arranged to be symmetrical with respect to a straight line that extends in the direction of substrate conveyance through the center axis of rotation of the first and second drive shafts 11 and 12. It is therefore possible to press and hold (grip) the substrate 10 in a well-balanced manner.

Moreover, in the present embodiment, the moving distances of the gripping section 730 of the left clamp latch member 73L and the gripping section 73O of the right clamp latch member 73R are set to be smaller than the moving distance of the follower mechanism section 6 in the direction of substrate conveyance. It is thereby possible to set the timing and time of the gripping surface 732 of the left clamp latch member 73L and the gripping surface 732 of the right clamp latch member 73R within a predetermined range with respect to the timing of pressing of the substrate 10 by the pressing section 6a of the follower mechanism section 6. Consequently, it is possible to grip the substrate 10 with high precision.

Furthermore, according to the present embodiment, the sliding portions of the cam mechanisms in the left clamp latch mechanism 70L and the right clamp latch mechanism 70R can be located under the substrate 10. This can prevent the surface of the substrate 10 from contamination with, for example, dust generated by the sliding portions.

Figure 11:
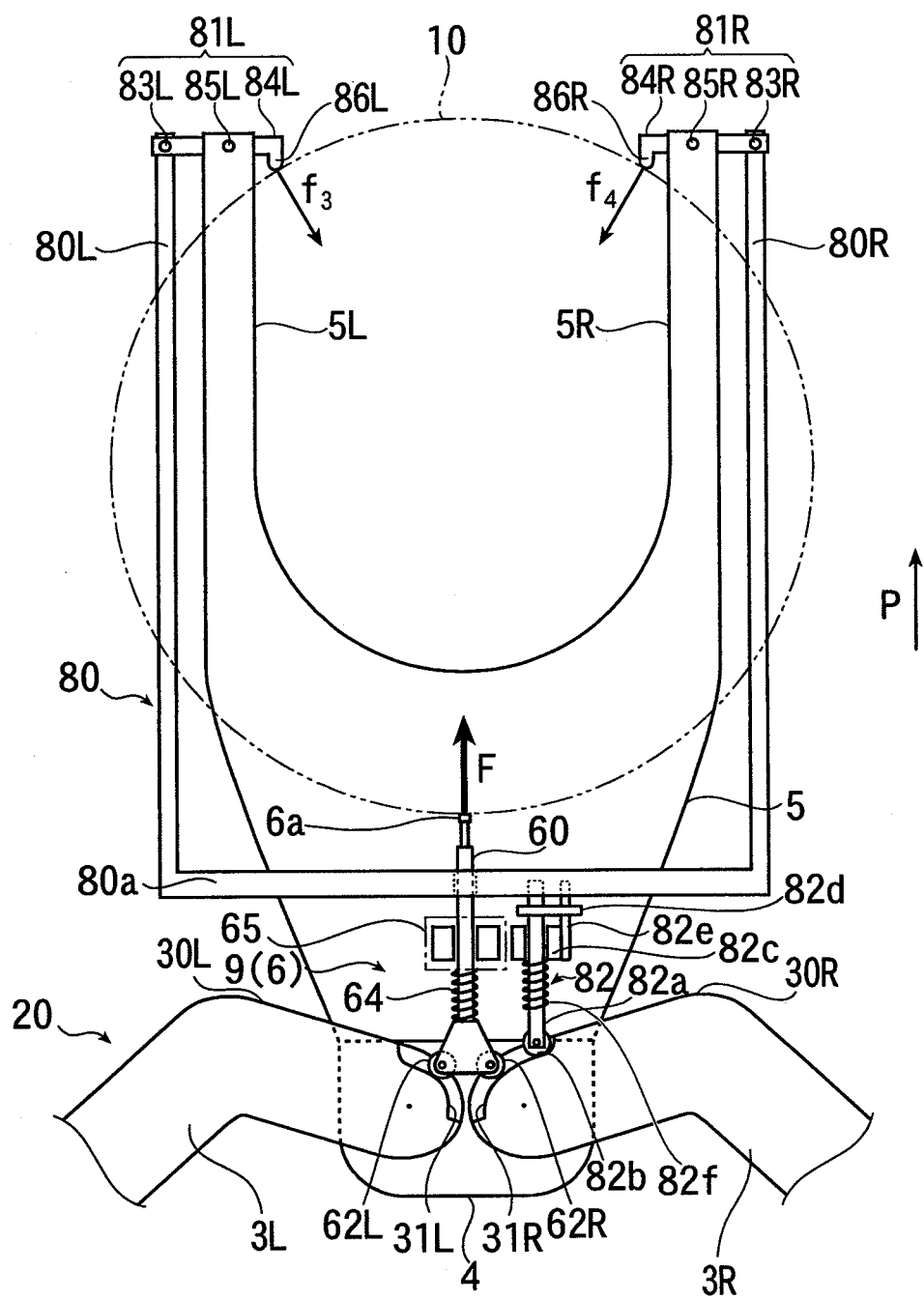
FIG. 11 is a plan view showing a pressing section and clamp latch mechanisms of yet another embodiment of the present invention.
Figure 12A:
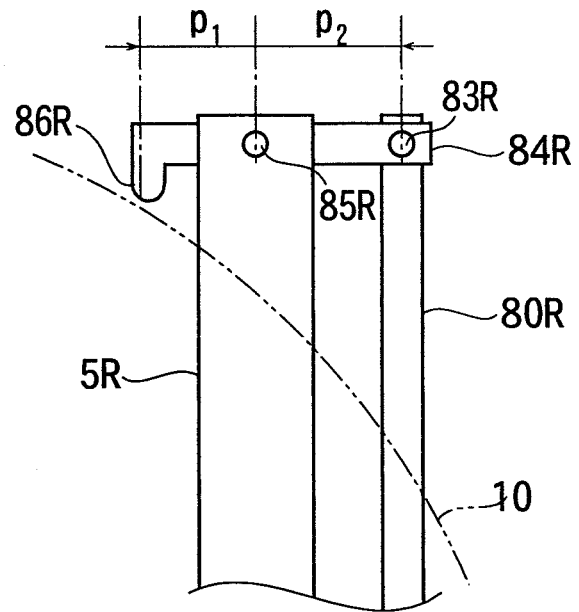
FIGS. 12(a) and 12(b) are plan views showing essential parts of a clamp latch mechanism.
Figure 12B:
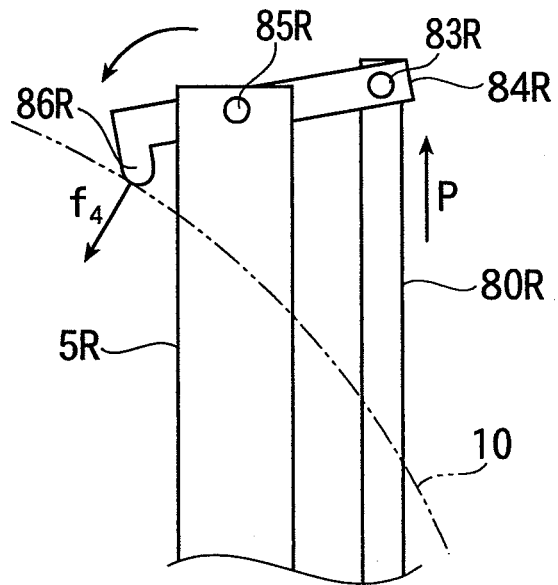

FIGS. 11, 12(a), and 12(b) show yet another embodiment of the present invention. FIG. 11 is a plan view showing the pressing section and clamp latch mechanisms. FIGS. 12(a) and 12(b) are plan views showing essential parts of a clamp latch mechanism. Parts corresponding to those of the foregoing embodiments will hereinafter be designated by identical reference numerals, and a detailed description thereof will be omitted.

As shown in FIG. 11, in the present embodiment, clamp latch mechanisms 81L and 81R, which are gripping mechanisms of a link type, to be described later, are arranged on the top ends of the support member 5L and 5R of the mounting section 5, respectively. A drive member 80 for driving the clamp latch mechanisms 81L and 81R is also provided.

The drive member 80 is made of a generally "U" shaped member. The drive member 80 is composed of a base section 80a of a straight bar shape, and a left drive section 80L and a right drive section 80R of a straight bar shape which extend from respective ends of the base section 80a in a direction orthogonal to the base section 80a.

In the present embodiment, the drive member 80 is arranged with the base section 80a orthogonal to the direction of substrate conveyance, and is configured such that the body section 60 of the follower mechanism section 6 pierces through the base section 80a. With such a structural arrangement and configuration, the body section 60 of the follower mechanism section 6 and the drive member 80 can make relative movements in the direction of substrate conveyance and in the opposite direction.

The length of the base section 80a of the drive member 80 is set to be longer than the pitch between the support members 5L and 5R of the mounting section 5. When the drive member 80 is mounted on the conveying device 50, the left drive section 80L and the right drive section 80R are therefore located outside the support members 5L and 5R, respectively.

The left drive section 80L and the right drive section 80R of the drive member 80 are arranged to be symmetrical with respect to a straight line that extends in the direction of substrate conveyance through the center axis of rotation of the first and second drive shafts 11 and 12.

The drive member 80 can receive a force from the third right arm 3R of the link mechanism 20 through a power transmission mechanism 82, as described below.

The power transmission mechanism 82 has a body section 82a of a straight bar shape. One of the ends of the body section 82a is orthogonally attached and fixed to the base section 80a of the foregoing drive section 80.

A follower roller 82b of perfect circular shape is rotatably supported in a horizontal plan at the other end of the body section 82a of the power transmission mechanism 82.

The third right arm 3R has a cam drive surface 31R which is formed having a greater length from the top end of the third right arm 3R to the rear end than the length of the embodiment shown in FIG. 8.

The power transmission mechanism 82 is juxtaposed to the right of the follower mechanism section 6, with the follower roller 82b in contact with the cam drive surface 31R. The body section 82a of the power transmission mechanism 82 is guided by a guide member 82c which is formed, for example, on the surface of the mounting section 5 so that the body section 82a moves straight in the direction of substrate conveyance or the opposite direction.

In the present embodiment, an attachment member 82d is fixed to near the end of the body section 82a of the power transmission mechanism 82 in the direction of substrate conveyance. A fixation pin 82e of bar shape is attached to this attachment member 82d. Then, an end of the fixation pin 82e is attached and fixed to the base section 80a of the drive member 80, and the other end of the fixation pin 82e is fixed to, for example, the guide member 82c. Such configuration is employed to prevent a rotation between the body section 82a of the power transmission mechanism 82 and the base section 80a of the drive member 80.

One end of a left link member 84L to be described later is supported by the top end of the left drive section 80L of the drive member 80 so as to be horizontally rotatable about a spindle 83L. One end of a right link member 84R to be described later is supported by the top end of the right drive section 80R of the drive member 80 so as to be horizontally rotatable about a spindle 83R.

The body section 82a is provided with, for example, a coil spring 82f. One end of the coil spring 82f is fixed to the body section 82a, and the other end is in contact with an end of the guide member 82c. The coil spring 82f applies force to the body section 82a to the upstream side in the direction of substrate conveyance, whereby the gripping of the substrate 10 with gripping sections 86L and 86R is released when the link mechanism 20 is extended.

The left link member 84L and the right link member 84R are made of members of the same generally "L" shape. The gripping sections 86L and 86R having, for example, a rounded shape are formed on the extremities where they are not supported by the left drive section 80L or the right drive section 80R of the drive member 80, so as to extend in a direction orthogonal to the body portions of the left link member 84L and the right link member 84R.

The left link member 84L and the right link member 84R are supported at their respective midsections so as to be horizontally rotatable about spindles 85L and 85R, which are provided on the top ends of the respective support members 5L and 5R of the mounting section 5. The left link member 84L and the right link member 84R are arranged with their respective gripping sections 86L and 86R being directed in the direction opposite to that of substrate conveyance.

With such a configuration, the gripping sections 86L and 86R of the left clamp latch mechanism 81L and right clamp latch mechanism 81R are arranged to be symmetrical with respect to a straight line that extends in the direction of substrate conveyance through the center axis of rotation of the first and second drive shafts 11 and 12.

To avoid dust outbreak, the portions of the gripping sections 86L and 86R where contact is made with the rim of the substrate 10 may be coated with a heat resistant resin material (such as, PTFE (polytetrafluoroethylene resin)).

Next, the principle of operation and configuration of the present embodiment will be described in detail in reference to FIGS. 11, 12(a), and 12(b).

In the present embodiment, the left clamp latch mechanism 81L and the right clamp latch mechanism 81R are configured to operate by the same mechanism. Hereinafter, the configuration and operation of the gripping mechanism of link type according to the present invention will be described by making reference to the right clamp latch mechanism 81R.

Figure 3A:
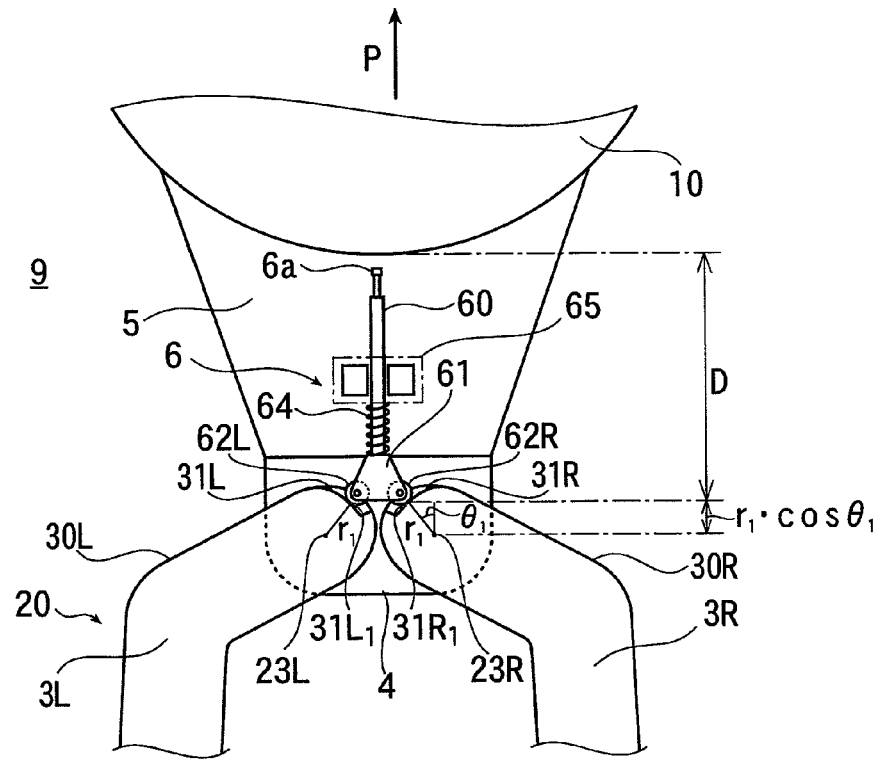
FIGS. 3(a) and 3(b) are explanatory diagrams detailing the principle of operation and configuration of the present invention.
Figure 3B:
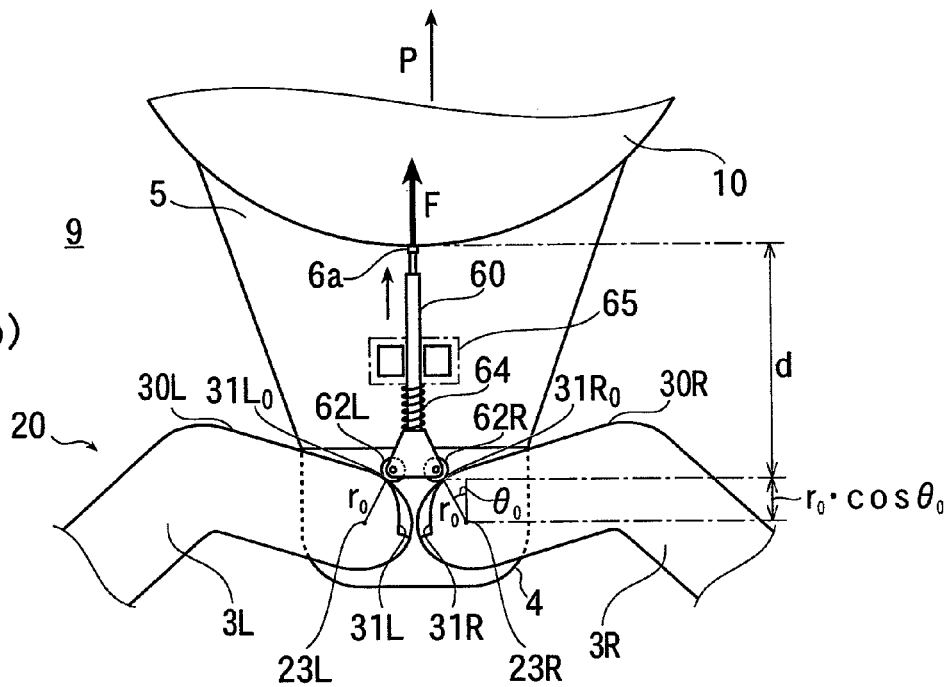

In the present embodiment, similar to the embodiment shown in FIGS. 3(a) and 3(b), the length of the follower mechanism section 6 is set such that the pressing section 6a at the downstream side of the follower mechanism section 6 in the direction of substrate conveyance is not in contact with the side portion of the substrate 10 to be conveyed when the link mechanism 20 is expanded.

When the link mechanism 20 is contracted, the follower mechanism section 6 moves to the downstream side in the direction of substrate conveyance so that the pressing section 6a of the follower mechanism section 6 comes into contact with the side portion of the substrate 10 to be conveyed.

The power transmission mechanism 82 of the present embodiment is configured to move with the follower mechanism section 6 in the same direction.

More specifically, when the link mechanism 20 is expanded, for example, as FIG. 12(a) shows for the right link member 84R, the shape of the third cam drive surface 31R of the third right arm, the lengths of the follower roller 82b and the body section 82a of the power transmission mechanism 82, the lengths of the base section 80a and the right drive section 80R of the drive member 80, the length of the right link member 84R (gripping section 86R), and the positions of the spindles 83R and 85R are individually set such that the gripping section 86R is not in contact with the rim of the base section 10.

For the left link member 84L, the lengths of the base section 80a and the left drive section 80L of the drive member 80, the length of the left link member 84L (gripping section 86L), and the positions of the spindles 83L and 85L are individually set such that the gripping section 86L is not in contact with the rim of the base section 10.

In the present invention, it is preferred, but not particularly limited, that the pitch $P_1$ between the contact area of the gripping section 86R with the substrate 10 and the spindle 85R of the support member 5R is configured to be smaller than the pitch $P_2$ between the spindle 85R of the support member 5R and the spindle 83R of the right drive section 80R, for example, as FIG. 12(a) shows for the right link member 84R.

For the left link member 84L, it is also preferred, though not shown, that the pitch between the contact area of the gripping section 86L with the substrate 10 and the spindle 85L of the support member 5L is smaller than the pitch between the spindle 85L of the support member 5L and the spindle 83L of the right drive section 80L.

With such configuration, the moving distances of the gripping section 86L of the left link member 84L and the gripping section 86R of the right link member 84R can be set to be smaller than the moving distance of the follower mechanism section 6 in the direction of substrate conveyance.

In the present embodiment, when the third left arm 3L and the third right arm 3R are rotated in the directions of contracting the link mechanism 20 from the state where the link mechanism 20 is extended, the body section 60 of the follower mechanism section 6 moves in the direction of substrate conveyance. In the meantime, the force from the cam drive surface 31R of the third right arm 3R is transmitted to the base section 80a of the drive member 80 through the power transmission mechanism 82, whereby the drive member 80 is moved in the direction of substrate conveyance.

Consequently, the left link member 84L and the right link member 84R rotate about the spindles 85L and 85R such that the gripping sections 86L and 86R move in the direction opposite from the direction of substrate conveyance (see FIG. 12(b)).

In the present embodiment, when the link mechanism is contracted, the shape of the third cam drive surface 31R of the third right arm, the lengths of the follower roller 82b and the body section 82a of the power transmission mechanism 82, the lengths of the base section 80a, the left drive section 80L, and the right drive section 80R of the drive member 80, the lengths of the left link member 84L and the right link member 84 (gripping sections 86L and 86R), and the positions of the spindles 83L, 85L, 83R, and 85R described above are individually set such that the gripping section 86L of the left link member 84L and the gripping section 86R of the right link member 84R make contact with the rim of the substrate 10 which is pressed and moved by the pressing section 6a of the follower mechanism section 6 in the direction of substrate conveyance.

According to the present embodiment having such a configuration, when the link mechanism 20 is contracted, the substrate 10 undergoes force F in the direction of substrate conveyance from the pressing section 6a of the follower mechanism section 6, and inward forces $f_3$ and $f_4$ from the left link member 84L of the left clamp latch mechanism 81L and the right link member 84R of the right clamp latch mechanism 81R, as shown in FIG. 11. As a result, the substrate 10 undergoes the pressing forces from the upstream side and downstream side in the direction of substrate conveyance, whereby the substrate 10 is reliably held (gripped) on the mounting section 5.

When the link mechanism 20 is in such a contracted state, the first left arm 1L and the first right arm 1R can be rotated in the same direction to perform circling while gripping the substrate 10.

The timing when the pressing section 6a of the follower mechanism section 6, the gripping section 86L of the left clamp latch member 84L and the gripping section 86R of the right clamp latch member 84R come into contact with the substrate 10 may be simultaneous with when the link mechanism 20 is fully contracted, or may be before (immediately before) the link mechanism 20 is fully contracted. The timing may be appropriately changed depending on the size, arrangement, and configuration of the conveying device and the vacuum apparatus to which the present invention is applied.

Keeping in mind gripping the substrate 10 with high precision, the preferred configuration is such that the gripping section 86L of the left clamp latch member 84L and the gripping section 86R of the right clamp latch member 84R make contact with the rim of the substrate 10 after the pressing section 6a of the follower mechanism section 6 has made contact with the rim of the substrate 10.

In the present embodiment, the gripping section 86L of the left clamp latch mechanism 81L and the gripping section 86R of the right clamp latch mechanism 81R are arranged to be symmetrical with respect to a straight line that extends in the direction of substrate conveyance through the center axis of rotation of the first and second drive shafts 11 and 12. It is therefore possible to press and hold (grip) the substrate 10 in a well-balanced manner by the gripping section 86L of the left clamp latch member 84L and the gripping section 86R of the right clamp latch member 84R.

Moreover, in the present embodiment, the moving distances of the gripping section 86L of the left clamp latch member 84L and the gripping section 86R of the right clamp latch member 84R are set to be smaller than the moving distance of the follower mechanism section 6 in the direction of substrate conveyance. This makes it possible to set the timing and time of the gripping section 86L of the left clamp latch member 84L and the gripping section 86R of the right clamp latch member 84R within a predetermined range with respect to the timing of pressing of the substrate 10 by the pressing section 6a of the follower mechanism section 6, so that the substrate 10 can be gripped with high precision.

In the present embodiment, the sliding portions of the link mechanisms in the left clamp latch mechanism 81L and the right clamp latch mechanism 81R can be located lateral to and away from the substrate 10. This can prevent the surface of the substrate 10 from being contaminated with, for example, dust generated by the sliding portions.

The present invention is not limited to the foregoing embodiments, and various modifications may be made thereto.

For example, in the foregoing embodiments, the cam drive surfaces 31L and 31R of the third left arm 3L and the third right arm 3R are configured such that the amount of displacement $r_1$ at the respective top sides is smaller than the amount of displacement $r_0$ at the respective base sides ($r_1 < r_0$).

Figure 4A:
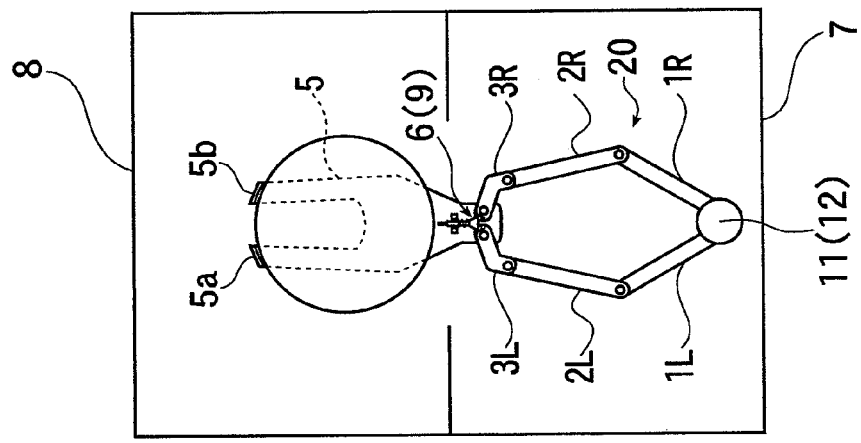
FIGS. 4(a) to 4(c) are explanatory diagrams showing the operation of the conveying device according to the embodiment of the present invention.
Figure 4B:
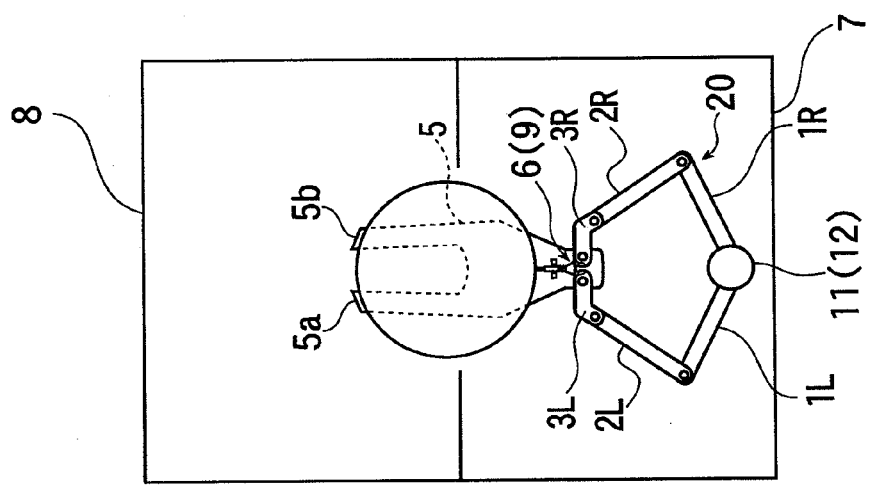
Figure 4C:
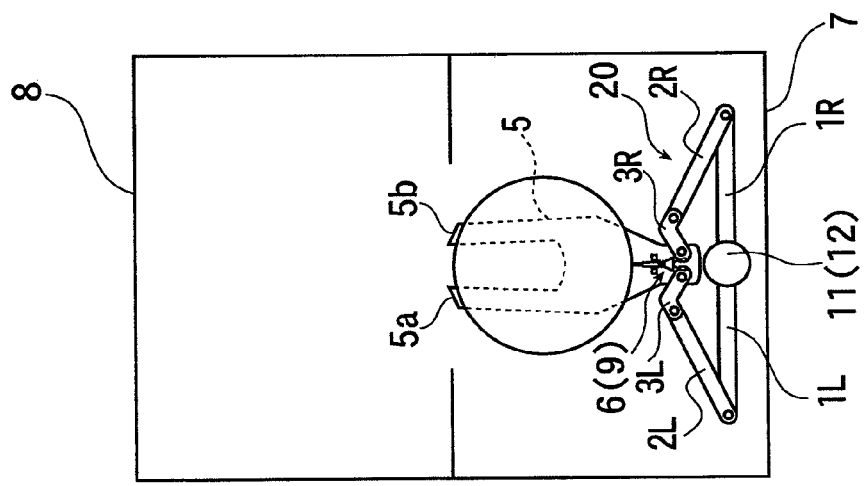

For a conveying device having a plurality of process chambers 8 such as shown in FIGS. 4(a) to 4(c), however, the position to transfer the substrate 10 is not always the same and the distances from the center axis of the drive shafts 11 and 12 to the transfer positions in the respective process chambers 8 differ depending on the internal configurations of the process chambers 8.

If the distance to a transfer position (i.e., the transfer distance is small), the gap between the edge of the substrate 10 and the pressing section 6a upon the transfer of the substrate 10 may be so small that the pressing section 6a collides with the edge of the substrate 10 to cause the problems of dust outbreak and substrate displacement.

Figure 13:
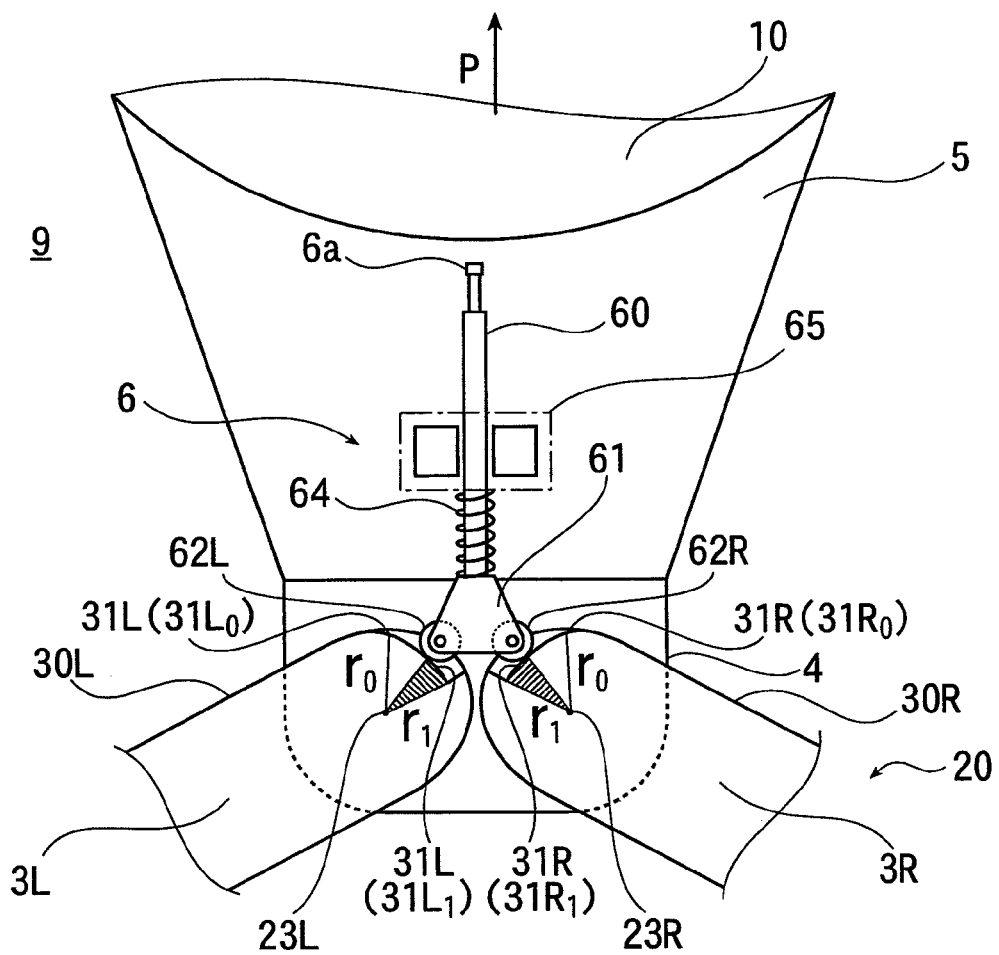
FIG. 13 is a configuration diagram showing essential parts of yet another embodiment of the present invention.
Figure 14:
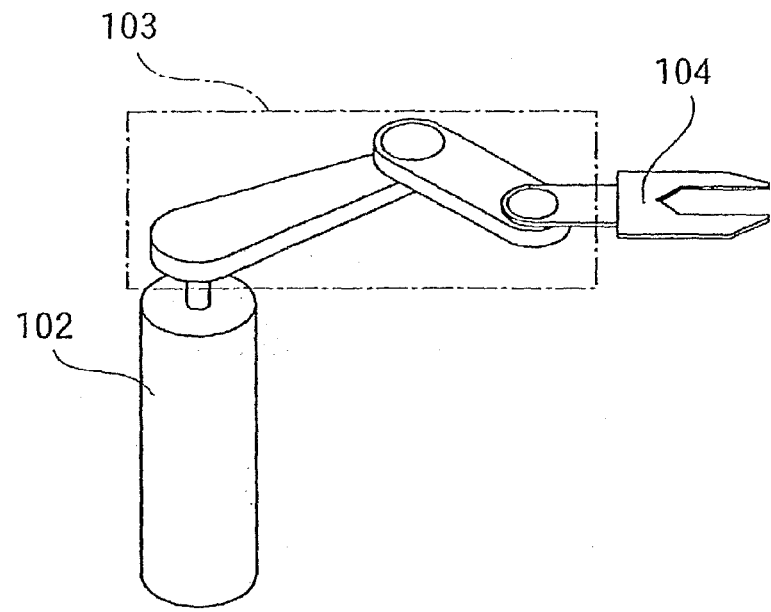
FIG. 14 is a schematic configuration diagram of a conveying device according to a conventional technology.
Figure 15:
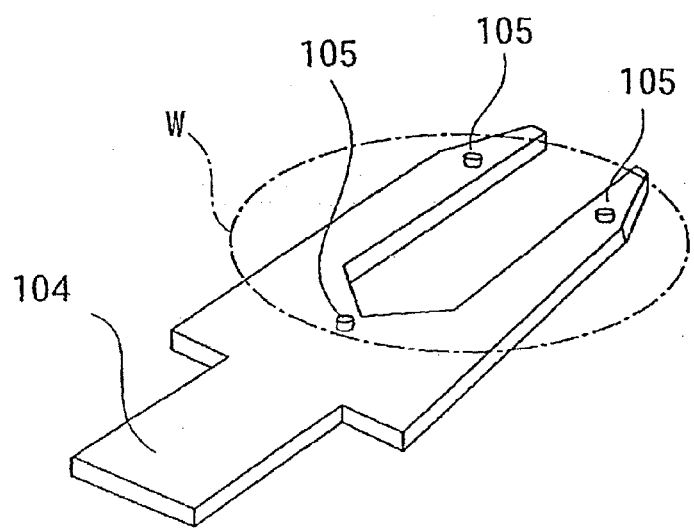
FIG. 15 is a schematic configuration diagram showing essential parts of the conveying device according to the conventional technology.

To avoid such problems, for example, the top sides of the cam drive surfaces 31L and 31R of the third left arm 3L and the third right arm 3R may be shaped to have a constant amount of displacement across a predetermined angular range as shown by the shadowed areas in FIG. 13. That is, the top sides of the cam drive surfaces 31L and 31R may be formed into a circular shape having the same radius as the amount of displacement $r_1$.

With such a configuration, the body section 60 of the follower mechanism section 6 makes non-linear movement in the direction of substrate conveyance while the follower rollers 62L and 62R are in contact with the cam drive surfaces 31L and 31R within the range of the radius $r_1$ shown shadowed in the diagram. Since the edge of the substrate 10 and the pressing section 6a can be maintained at a non-contact distance regardless of whether the transfer distance is small or large, it is possible to avoid the problems of dust production and substrate displacement.

In the present embodiment, the two adjoining cam drive surfaces 31L and 31R and the two corresponding follower rollers 62L and 62R are combined to constitute the cam mechanism of the pressing means 6. However, the present invention is not limited thereto. A single cam drive surface and a corresponding single follower roller can be combined to constitute the cam mechanism of the pressing means. Three or more cam drive surface and three or more corresponding follower rollers can be combined to constitute the cam mechanism of the pressing means.

In view of holding (gripping) the substrate 10 in a well-balanced manner, however, it is preferred as in the foregoing embodiments that the adjoining two cam drive surfaces 31L and 31R and the two corresponding follower rollers 62L and 62R are combined to constitute the cam mechanism of the pressing means 6.

It should be appreciated that the cam mechanism of the pressing means may be modified as appropriate, such as in the shape of the cam drive surfaces and the size of the follower rollers, depending on the conveying device to which the present invention is applied.

The present invention may also be applied to a conveying device having various link mechanisms.

For example, while in the foregoing embodiments, the third left arm 3L and the third right arm 3R having the cam drive surfaces 31L and 31R are rotated to operate the follower mechanism section 6 by the cam mechanism, the present invention is not limited thereto. The foregoing operation can be implemented by forming cam drive surfaces on the second left arm 2L and the second right arm 2R.

A plurality of adjoining link sections that make relative parallel movements with respect to each other (such as, a parallel link arm mechanism) may be provided with cam drive surfaces such that the follower mechanism section moves along the cam drive surfaces to hold the object to be conveyed by the foregoing operation.

In the embodiment shown in FIGS. 8, 9(a), 9(b), 10(a), and 10(b), the left drive member 71L and the right drive member 71R (the respective gripping surfaces 732 in particular) of the left clamp latch mechanism 70L and the right clamp latch mechanism 70R are arranged to be symmetrical with respect to a straight line that extends in the direction of substrate conveyance through the center axis of rotation of the first and second drive shafts 11 and 12. However, the present invention is not limited thereto, and the drive members may be arranged to be asymmetrical with respect to the straight line.

In the embodiment shown in FIGS. 8, 9(a), 9(b), 10(a), and 10(b), two gripping mechanisms of a cam type (left clamp latch mechanism 70L, right clamp latch mechanism) are provided. Depending on such factors as the shape and size of the substrate 10 and the device configuration, one, or three or more gripping mechanisms of a cam type may be provided.

In the embodiment shown in FIGS. 11, 12(a), and 12(b), the gripping section 86L of the left clamp latch mechanism 81L and the gripping section 86R of the right clamp latch mechanism 81R are arranged to be symmetrical with respect to a straight line that extends in the direction of substrate conveyance through the center axis of rotation of the first and second drive shafts 11 and 12. However, the present invention is not limited thereto, and the gripping sections may be arranged to be asymmetrical with respect to the straight line.

In the embodiment shown in FIGS. 11, 12(a), and 12(b), there are provided two gripping mechanisms of a link type (left clamp latch mechanism 81L, right clamp latch mechanism 81R). Depending on such factors as the shape and size of the substrate 10 and the device configuration, one, or three or more gripping mechanisms of a link type can be provided.

Moreover, the foregoing embodiment shown in FIGS. 5 to 7 and the foregoing embodiment shown in FIGS. 8, 9(a), 9(b), 10(a), and 10(b) or FIGS. 11, 12(a), and 12(b) may be arbitrarily combined.

In addition, the present invention may be used to convey not only a circular substrate (such as, an Si wafer), but also a rectangular substrate (such as, a glass substrate) and various types of substrates including elliptic and polygonal shaped substrates.

What is claimed is:

1. A conveying device, comprising:
a link mechanism, which can expand and contract, having a plurality of arms to which power from a drive source is transmitted; and
a mounting section connected to an operating tip section of the link mechanism through a drive link section and on which an object to be conveyed is mounted,
wherein the mounting section has a latch section for making contact with and latching a side portion of the object to be conveyed,
wherein the drive link section of the link mechanism is provided with cam mechanism-based pressing means, and
wherein the pressing means includes cam drive surfaces formed on a pair of the adjacent drive link section of the link mechanism, respectively, and a pair of follower rollers being in contact with and capable of following the cam drive surfaces, respectively, and a follower mechanism section has a body section guided by a guide member, a compression coil spring attached around the body section, and a protruding pin shape pressing section to be guided and moved along a direction toward the latch section of the mounting section by movement of the pair of follower rollers.

2. The conveying device according to claim 1, wherein the follower mechanism section of the pressing means has a pressing force adjusting member for adjusting a pressing force on the cam drive surface.

3. The conveying device according to claim 1, wherein the pressing section of the follower mechanism section of the pressing means has a force reducing member for reducing the pressing force of the pressing section.

4. The conveying device according to claim 1, wherein the latch section of the mounting section has a gripping mechanism that presses the object to be conveyed and grips the object to be conveyed with the pressing means, the gripping mechanism being driven by a drive mechanism that moves toward the pressing means according to an operation of the drive link section of the link mechanism.

5. The conveying device according to claim 4, wherein the drive mechanism is provided with a drive section of cam type, and wherein the gripping mechanism has a gripping section of a cam type that is driven by the drive section of a cam type.

6. The conveying device according to claim 4, wherein the drive mechanism is provided with a drive section of a cam type, and the gripping mechanism is provided with a gripping section of a link type that is driven by engagement with the drive section of a cam type.

7. The conveying device according to claim 4, wherein the device includes two of the gripping mechanism, and the gripping sections of the respective gripping mechanisms are arranged to be symmetrical with respect to a straight line that extends in a direction of substrate conveyance through center axes of rotation of the first and second drive shafts.

8. A vacuum apparatus, comprising:
a vacuum chamber;
a conveying device including a link mechanism, which can expand and contract, having a plurality of arms to which power from a drive source is transmitted; and
a mounting section connected to an operating tip section of the link mechanism through a drive link section and on which an object to be conveyed is mounted,
wherein the mounting section has a latch section for making contact with and latching a side portion of the object to be conveyed,
wherein the drive link section of the link mechanism has a cam mechanism-based pressing means,
wherein the pressing means includes cam drive surfaces formed on a pair of the adjacent drive link section of the link mechanism, respectively, and a pair of follower rollers being in contact with and capable of following the cam drive surfaces, respectively, and a follower mechanism section having a body section guided by a guide member, a compression coil spring attached around the body section, and a protruding pin shape pressing section to be guided and moved along a direction toward the latch section of the mounting section by movement of the pair of follower rollers, and
wherein the mounting section of the conveying device is carried in and out of the vacuum chamber.

* * * * *